US010169493B2

(12) United States Patent
Clarysse et al.

(10) Patent No.: US 10,169,493 B2
(45) Date of Patent: Jan. 1, 2019

(54) METHOD FOR MANIPULATING A COMPUTER AIDED DESIGN (CAD) MODEL, COMPUTER PROGRAM PRODUCT AND SERVER THEREFORE

(71) Applicant: Menhirs NV, Ghent (BE)

(72) Inventors: Pieter Clarysse, Vurste (BE); Shivdeep Garud, Singapore (SG); Hans De Backer, Sint-Michiels (BE)

(73) Assignee: Bricsys NV, Ghent (BE)

( * ) Notice: Subject to any disclaimer, the term of this patent is extended or adjusted under 35 U.S.C. 154(b) by 294 days.

(21) Appl. No.: 14/909,374

(22) PCT Filed: Aug. 7, 2013

(86) PCT No.: PCT/EP2013/066521
§ 371 (c)(1),
(2) Date: Feb. 1, 2016

(87) PCT Pub. No.: WO2015/018441
PCT Pub. Date: Feb. 12, 2015

(65) Prior Publication Data
US 2016/0179986 A1 Jun. 23, 2016

(51) Int. Cl.
*G06F 17/50* (2006.01)
*G06F 3/0482* (2013.01)

(52) U.S. Cl.
CPC ............ *G06F 17/50* (2013.01); *G06F 3/0482* (2013.01)

(58) Field of Classification Search
USPC ........ 703/2, 22; 345/157, 619; 715/782, 769
See application file for complete search history.

(56) References Cited

U.S. PATENT DOCUMENTS 5,299,307 A * 3/1994 Young ................. G06F 3/04845 345/157
5,701,424 A 12/1997 Atkinson
6,614,458 B1 9/2003 Lambert et al.
8,136,045 B2 3/2012 Miura et al.
(Continued)

OTHER PUBLICATIONS

Ashlar-Vellum Incorporated, Cobalt, Xenon & Argon, Designer Elements, 3D Modeling User Guide,Chapters 1-3, pp. A1-3-14 (Jan. 2003).
(Continued)

*Primary Examiner* — Thai Q Phan
(74) *Attorney, Agent, or Firm* — James Creighton Wray

(57) ABSTRACT

The disclosed method for manipulating a computer aided design (CAD) model includes the computer-implemented steps of a user determining one or more entities in a CAD model with a cursor, determining a set of adequate user action(s) to execute on the entities and providing a suggestion menu which contains the set of adequate user actions, partly determined by previously executed user actions. A second method for manipulating a CAD model includes the computer-implemented steps of a user determining one or more entities with a cursor, determining a set of adequate user actions to execute on the entities and providing a suggestion menu which contains the set of adequate user actions, partly determined by a geometric analysis on any of the entities in an area within a predetermined proximity of the cursor. A computer program product and server for manipulating a CAD model are also described.

18 Claims, 7 Drawing Sheets

(56) References Cited

U.S. PATENT DOCUMENTS

2006/0075356 A1* 4/2006 Faulkner ................ G06T 17/05 715/782
2011/0279229 A1* 11/2011 Nielsen ............ G06F 17/30241 340/8.1
2013/0055126 A1* 2/2013 Jackson ............. G06F 3/04845 715/769
2013/0135343 A1* 5/2013 Nielsen ............ G06F 17/30241 345/619

OTHER PUBLICATIONS

Li et al., "Design and Evaluation of a Command Recommendation System for Software Applications," *ACM Transactions on Computer-Human Interaction*, vol. 18(2), Article 6, pp. 1-35 (Jun. 2011).
McGrenere et al., "An Evaluation of a Multiple Interface Design Solution of Bloated Software," CHI 2002 Conference Proceedings, Conference on Human Factors in Computing Systems, Minneapolis, MN, Apr. 20-25, 2002, *CHI Letters*, vol. 40(1), pp. 163-170 (Apr. 20-25, 2002).
Yoo et al., "DEBBIE: A Configurable User Interface for CAD Frameworks," Proceedings of the International Conference on Computer Design: VLSI in Computers and Processors, Cambridge, MA., Sep. 17-19, 1990; Siemens Corporate Research, Inc., Princeton, NJ, pp. 135-140 (Sep. 17-19, 1990).

* cited by examiner

METHOD FOR MANIPULATING A COMPUTER AIDED DESIGN (CAD) MODEL, COMPUTER PROGRAM PRODUCT AND SERVER THEREFORE

FIELD OF THE INVENTION

The present invention relates to a method, a computer program product and a server for manipulating a computer aided design (CAD) model.

BACKGROUND

CAD software applications provide users with the capability to create and edit geometry, models and drawings using actions or commands. Historically, these actions were launched from menus and toolbar buttons or command prompts which were placed at static locations on the screen. As a result, these actions were not always handy, i.e. near the present location of the cursor.

To address that, most CAD software applications like AutoCAD, Inventor, Solidworks, Spaceclaim, etc, and BricsCAD now provide a set of tools, hereby referred to as a 'context menu', that pops up near the cursor thereby reducing the time taken to access the commands.

This context menu typically can be invoked either by explicit user action like a right click, or by the software calculating if there is an entity of interest under the cursor and automatically invoking it.

Document U.S. Pat. No. 6,614,458B1 discloses a computer aided design method for mechanical design software application.

Document U.S. Pat. No. 8,136,045B2 discloses a method for managing menus associated with a graphical user interface that is displayed on a display unit.

Problem with these methods is to present a limited set of choices since all possible actions cannot be presented in that context menu. Typically these sets of choices are filtered in a rudimentary fashion depending on the type of entity/subentity that the cursor is being hovered on, and by the phase of modeling the user is in, which could be sketching, part modeling or assembly modeling.

Due to this rudimentary filtering, the set of options that get present are often generic or irrelevant, because the list of possible actions does not only depend on the single entity type or even the context.

There is a need for a CAD model manipulating method which provides more relevant possible user actions and which increases productivity by reducing time for a user to manipulate entities or subentities of a CAD model.

SUMMARY

The present invention provides in one embodiment, a method for manipulating a computer aided design (CAD) model, comprising the computer-implemented steps of:

a) a user determining one or more entities in a CAD model by means of a cursor;

b) determining a set of one or more adequate user actions to execute on said one or more entities;

c) providing a suggestion menu, comprising said set of one or more adequate user actions;

whereby said set of one or more adequate user actions is partly determined by previously executed user actions by said user, as described in claim 1.

It is advantageous as this greatly increases productivity by reducing the time taken to find the relevant user action or command from menus or toolbars. Also it allows to reduce the time and clicks taken to physically get to the relevant button.

In a second embodiment, the present invention provides a method for manipulating a computer aided design (CAD) model, comprising the computer-implemented steps of:

a) a user determining one or more entities in a CAD model by means of a cursor;

b) determining a set of one or more adequate user actions to execute on said one or more entities;

c) providing a suggestion menu, comprising said set of one or more adequate user actions;

whereby said set of one or more adequate user actions is partly determined by a geometric analysis on any of one or more entities in an area within a predetermined proximity of the cursor, as described in claim 13.

In a third embodiment, the present invention provides a computer program product for manipulating a computer aided design (CAD) model, as described in claim 14.

In a fourth embodiment, the present invention provides a server for manipulating a computer aided design (CAD) model, as described in claim 15.

While multiple embodiments are disclosed, still other embodiments of the present invention will become apparent to those skilled in the art from the following detailed description, which shows and describes illustrative embodiments of the invention. As will be realized, the invention is capable of modifications in various obvious aspects, all without departing from the spirit and scope of the present invention. Accordingly, the drawings and detailed description are to be regarded as illustrative in nature and not restrictive.

DESCRIPTION OF THE FIGURES

Further features, advantages and objects of the present invention will become apparent for the skilled person when reading the following detailed description of embodiments of the present invention, when taken in conjunction with the figures of the enclosed drawings.

DETAILED DESCRIPTION OF THE INVENTION

Figure 1:
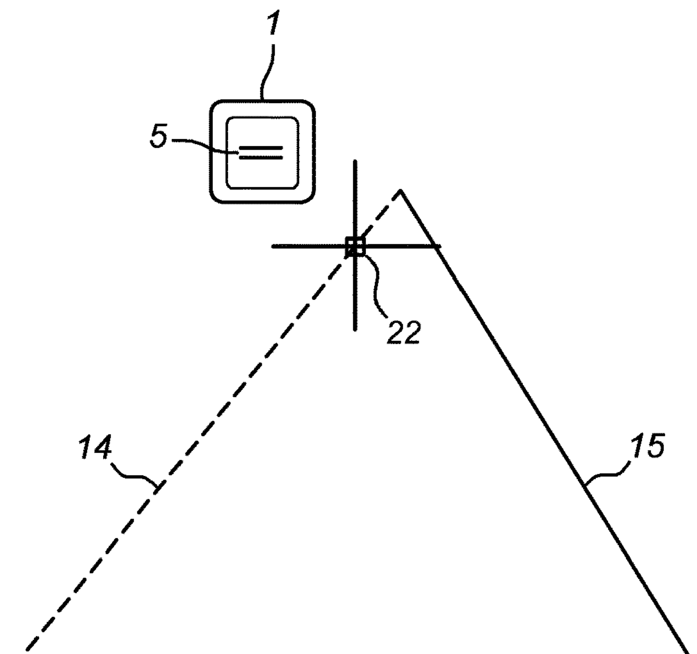
FIGS. 1-6 illustrate subsequent steps of manipulating a CAD 2D model layout in accordance with one embodiment of the invention.

The present invention relates to a method, a computer program product and a server for manipulating a computer aided design (CAD) model. Unless otherwise defined, all terms used in disclosing the invention, including technical and scientific terms, have the meaning as commonly understood by one of ordinary skill in the art to which this invention belongs. By means of further guidance, term definitions are included to better appreciate the teaching of the present invention.

"A", "an", and "the" as used herein refers to both singular and plural referents unless the context clearly dictates otherwise. By way of example, "an entity" refers to one or more than one entity.

"Comprise," "comprising," and "comprises" and "comprised of" as used herein are synonymous with "include", "including", "includes" or "contain", "containing", "contains" and are inclusive or open-ended terms that specifies the presence of what follows e.g. component and do not exclude or preclude the presence of additional, non-recited components, features, element, members, steps, known in the art or disclosed therein.

The recitation of numerical ranges by endpoints includes all numbers and fractions subsumed within that range, as well as the recited endpoints.

In a first aspect the present invention provides a method for manipulating a computer aided design (CAD) model, comprising the computer-implemented steps of:

a) a user determining one or more entities in a CAD model by means of a cursor;

b) determining a set of one or more adequate user actions to execute on said one or more entities;

c) providing a suggestion menu, comprising said set of one or more adequate user actions;

whereby said set of one or more adequate user actions is partly determined by previously executed user actions by said user.

The term "entity" in underlying invention is to be understood as a graphical element of a CAD drawing or model. Examples are lines, arcs, polylines, circles, ellipses, text, dimensions, leaders, hatches, solids, blocks, etc. The term "polyline" in underlying invention is to be understood as a continuous line composed of one or more line segments (i.e. lines). The term "dimension" in underlying invention is to be understood as a graphical entity which displays the measurement of another entity or set of entities in a CAD drawing. Dimensions can be of various types, linear, aligned, angular, radial, etc. For example, an aligned dimension on a line showing the length between the two points of the line or a radial dimension attached to a circle showing the radius measurement of the circle. The term "leader" in underlying invention is to be understood as a graphical entity that displays some textual notes associated with another entity or set of entities in a drawing. A leader typically has an arrow pointing to the entity(s) that it is displaying the text information for. The term "hatch" in underlying invention is to be understood as a graphical entity that represents a shaded or patterned region on a drawing.

The term "user action" in underlying invention is to be understood as an operation or command to be performed by the user on one or more entities in a CAD model. Examples are manifold. Also these user actions can be related to constraints, associations between entities, etc. The term "constraints" in underlying invention is to be understood a set of rules assigning spatial relationships between entities. Constraints can be geometrical or dimensional. E.g. a parallel geometrical constraint when applied between two lines forces the lines to remain parallel, no matter how they are modified (moved, rotated, stretched, etc). A dimensional constraint defined between the center of a circle and the end point of a line forces those two points to keep the same distance no matter how the line or circle is modified. Dimensional constraints have the added feature of being editable, i.e modifying the value of the constraint now modifies the entities to achieve the constraint. E.g. changing the distance value described earlier will result in the circle and/or line repositioning itself to satisfy the new value of the constraint. Also entities in a drawing can be associated with other entities in a drawing. For example, dimensions on a line are said to be associated with the line. If the line is modified, that dimension will be modified automatically. Similarly, if a closed region is hatched, modifying the region will modify the hatch.

It is advantageous as this method greatly increases productivity by reducing the time taken to find the relevant user action or command from menus or toolbars. Also it allows to reduce the time and clicks taken to physically get to the relevant button.

It is advantageous as it allows for a wider range of contexts for suggested user actions, such as 2D drafting, dimensioning, 2D constraints, 3D modeling, assembly modeling, architectural sketching, etc.

In a preferred embodiment said set of one or more adequate user actions is partly determined by frequently executed user actions by said user.

It is advantageous as providing more frequently executed user actions increases relevancy of said set of one or more adequate user actions. Therefore, editing time on a CAD drawing reduces and productivity increases.

In a preferred embodiment said set of one or more adequate user actions is partly determined by frequently executed sequences of user actions by said user.

Often multiple user actions are related and executed in a fixed order or sequence. Providing user actions coming next in a frequently executed sequence, increases the relevancy of provided user actions in said suggestion menu.

In a preferred embodiment said set of one or more adequate user actions is partly determined by user preference.

In a preferred embodiment said set of one or more adequate user actions is partly determined by a geometric analysis on any of one or more entities in an area within a predetermined proximity of the cursor.

This improves the relevancy of suggested user actions by analyzing neighbouring entities and their mutual geometric relationship and position. It is advantageous as more relevant or adequate user actions are provided based on said geometric relationships and/or analysis.

In a more preferred embodiment said set of one or more adequate user actions is determined by a weighed prioritization based on geometrical analysis, execution recentness, execution frequency and sequence execution frequency of one or more adequate user actions determined for one or more possible combinations of said one or more entities in an area within a predetermined proximity of the cursor.

In an even more preferred embodiment for a possible combination of two intersecting entities, the trimming user action is determined.

In an even more preferred embodiment for a possible combination of two non-intersecting entities, the extending user action is determined.

In an even more preferred embodiment for a possible combination of two entities joining in one or more points, the fillet user action and chamfer user action are determined for the point closest to the cursor position.

In a more preferred embodiment said area within a predetermined proximity of the cursor is a rectangular or circular area around the cursor position.

In a more preferred embodiment the radius of said circular area is determined by preferably around 3 times the pick box size.

The term "pick box size" in underlying invention is to be understood as the size of the predetermined box around the cursor tip defining the area wherein points or entities can be determined and/or selected.

In a preferred embodiment step c is performed by:

c1) providing a first suggestion menu, comprising one adequate user action;

c2) providing a second suggestion menu, comprising said set of one or more adequate user actions.

It is advantageous as it allows a quicker, more convenient and clear organizing of providing adequate user actions.

In a preferred embodiment said set of one or more adequate user actions is ordered in groups of related adequate user actions.

It is advantageous as it allows a better organizing and overview of user actions. Often subsequently performed user actions are related. By ordering said related user actions in said groups, action related user actions will be provided quicker, more clear and better organized.

In a more preferred embodiment within said groups said related adequate user actions are ordered via a weighed prioritization based on relevancy, execution recentness, execution frequency and sequence execution frequency of said adequate user actions.

In a preferred embodiment a suggestion menu is provided a predetermined time period subsequent to step a.

In a more preferred embodiment said predetermined time period amounts preferably between 0.1 s and 1.0 s, more preferably between 0.3 s and 0.7 s, most preferably around 0.5 s.

In a preferred embodiment said step a is performed by:

a1) determining a first entity of a CAD model;

a2) hovering the cursor on or within a predetermined proximity of a second entity of said CAD model.

In a more preferred embodiment step a1 is performed by selecting said first entity.

In a more preferred embodiment said first entity may be two or more entities.

This way the method also takes into account user actions to be performed on more than two entities.

In a more preferred embodiment step a1 is performed by said hovering of the cursor in step a2, wherein said hovering of the cursor is on or within a predetermined proximity of said second entity.

It is advantageous as it decreases time taken for performing a click and allows more quick and convenient editing of entities in a CAD model.

In a more preferred embodiment, said first entity is highlighted.

In a more preferred embodiment said first and/or said second entity is a subentity.

The term "subentity" in underlying invention is to be understood as an entity being part of an entity. Thus an entity can comprise multiple subentities. For example, some entities such as lines, arcs, etc are simple entities. Others are complex and may be composed of other simple entities. Entities such as polylines have lines and arcs as subentities. Entities such as solids have faces, edges and vertices as subentities. Entities such as a block can be composed of any kind of subentity such as lines, circles, polylines, solids or another block reference too.

This way the method is not limited to operations on entity level only. It is advantageous as it allows operations between a subentity and an entity or between a subentity and a subentity, whether or not forming part of a same entity.

In a more preferred embodiment said first or second entity is not part of a same entity as of said second or first entity respectively.

In an alternative more preferred embodiment said first or second entity is part of a same entity as of said second or first entity respectively.

In a second aspect the present invention provides a Method for manipulating a computer aided design (CAD) model, comprising the computer-implemented steps of:

a) a user determining one or more entities in a CAD model by means of a cursor;

b) determining a set of one or more adequate user actions to execute on said one or more entities;

c) providing a suggestion menu, comprising said set of one or more adequate user actions;

whereby said set of one or more adequate user actions is partly determined by a geometric analysis on any of one or more entities in an area within a predetermined proximity of the cursor.

This improves the relevancy of suggested user actions by analyzing neighbouring entities and their mutual geometric relationship and position. It is advantageous as more relevant or adequate user actions are provided based on said geometric relationships or analysis.

This method can have the same further preferred embodiments or combinations thereof as described above, e.g. partly determination by previously executed user actions, frequently executed user actions or frequently executed sequences of user actions, groups of related adequate user actions, entity properties, entity determination, first and/or second suggestion menu provision, etc.

In a third aspect the present invention provides a computer program product for manipulating a computer aided design (CAD) model, said computer program product comprising at least one computer-readable storage medium having computer-readable program code portions stored therein, the computer-readable program code portions comprising instructions for:

a) a user determining one or more entities in a CAD model by means of a cursor;

b) determining a set of one or more adequate user actions to execute on said one or more entities;

c) providing a suggestion menu, comprising said set of one or more adequate user actions;

whereby said set of one or more adequate user actions is partly determined by previously executed user actions by said user.

In a fourth aspect the present invention provides a server for manipulating a computer aided design (CAD) model using a computing device connected to the server via a network, the server comprising:

an input receiving module, the input receiving module configured to receive determination of one or more entities in a CAD model set forth by the user;

at least one processor, the at least one processor configured to:

a) a user determining one or more entities in a CAD model by means of a cursor;

b) determining a set of one or more adequate user actions to execute on said one or more entities;

c) providing a suggestion menu, comprising said set of one or more adequate user actions;

whereby said set of one or more adequate user actions is partly determined by previously executed user actions by said user.

EXAMPLES

FIGS. 1-6 illustrate subsequent steps of manipulating a CAD 2D model layout in accordance with one embodiment of the invention.

If two lines (14,15) are meeting in a sharp corner, and the cursor (22) is hovering over one of the entities (14) such that the point of intersection is within a certain predefined distance of the cursor, a first suggestion menu (1) is shown to the user (See FIG. 1). Said entity (14) is highlighted and said first suggestion menu (1) provides the last adequate executed user action (5).

Figure 2:
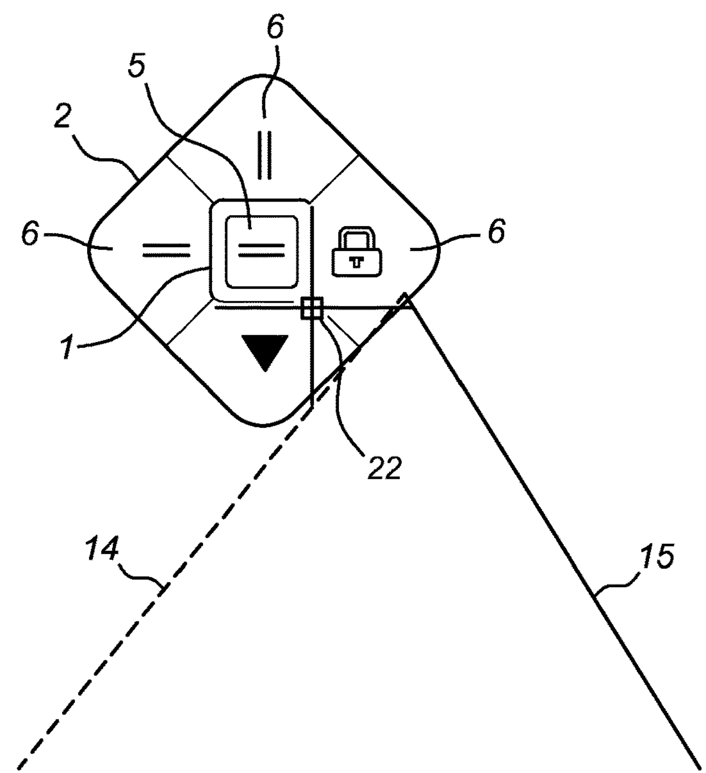

When the cursor is moved on top of said first suggestion menu (1), a second suggestion menu (2) is shown to the user, providing 3 adequate user actions (6) (See FIG. 2).

Figure 3:
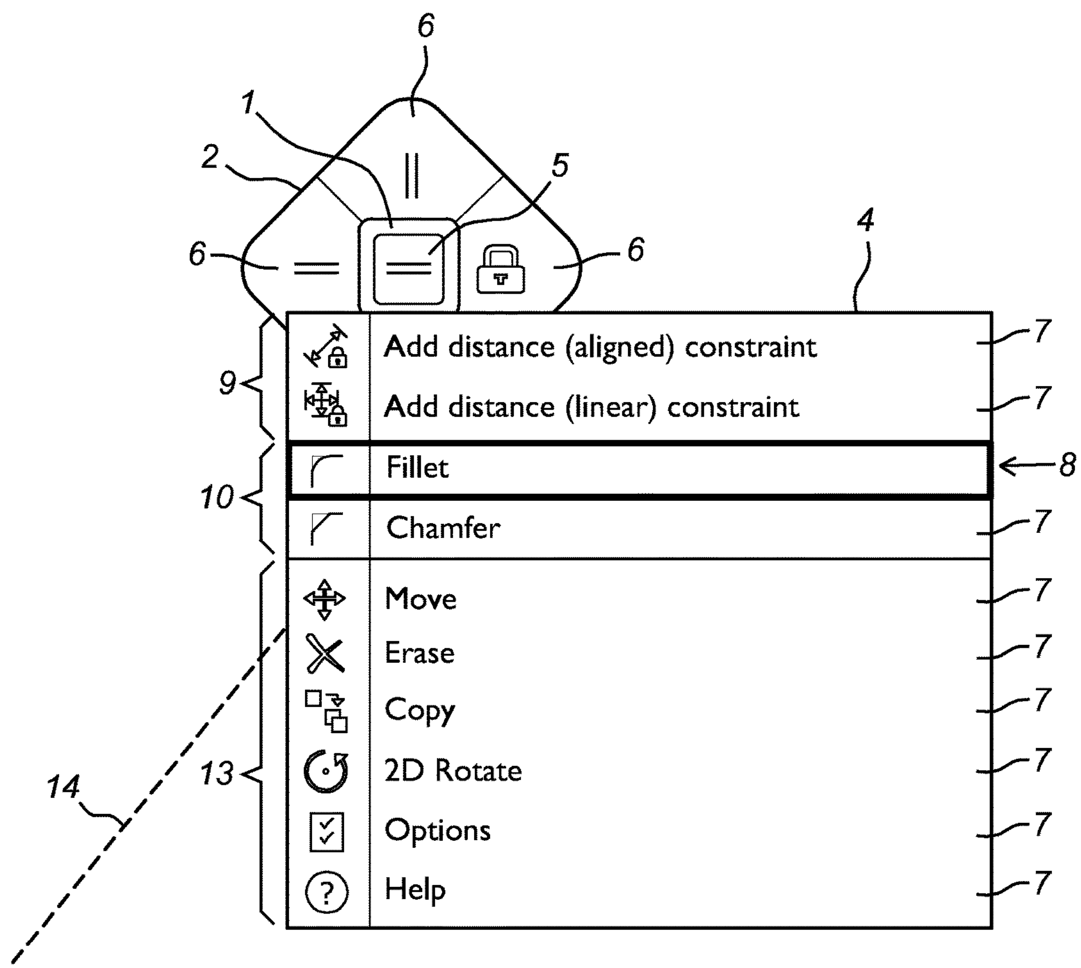

When the user moves the cursor towards the dropdown button (3), an expanded second suggestion menu (4) is shown (See FIG. 3). Next to the last adequate executed user action (5) and the adequate user actions (6) from the second suggestion menu (2), a dropdownbox (4) is shown to the user with extra adequate user actions (7,8).

This list of adequate user actions (5,6,7,8) is ordered in groups of related adequate user actions, such as the constraints group (9), fillet-chamfer group (10) and general group (13) (See FIG. 3). User actions (5, 6) are part of the first prioritized group, i.e. the constraints group (9). Said groups are ordered via a weighed prioritization based on relevancy, execution recentness, execution frequency and sequence execution frequency of adequate user actions for the entities (14) and (15).

Figure 4:
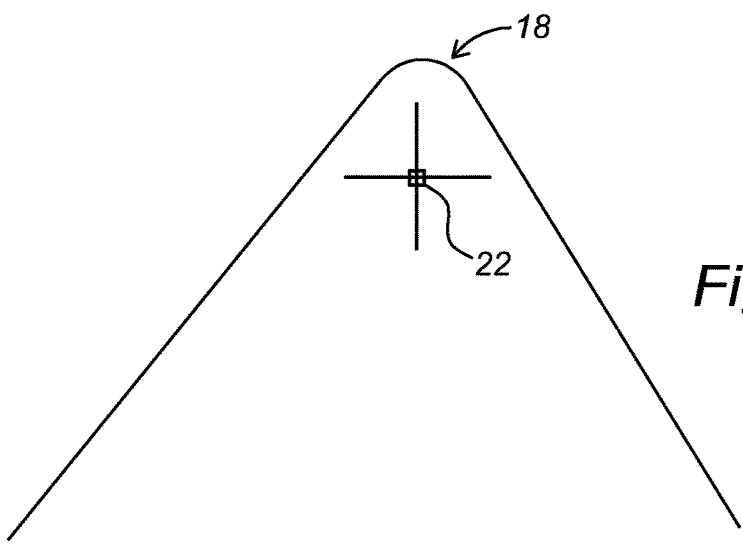

When the user selects the fillet user action (8), a filleting action will be performed on the joining point of the lines (14) and (15). FIG. 4 shows the filleted corner (18) of the entities (14,15).

Figure 5:
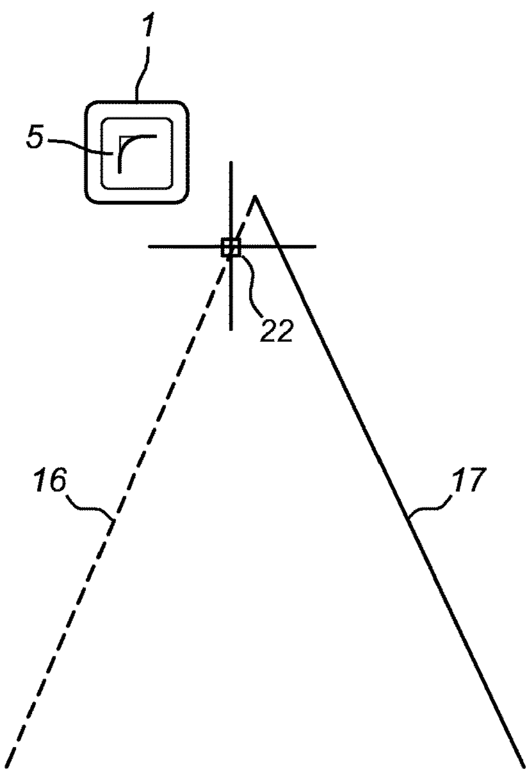

When subsequently for two other entities (16,17) joining in a point, the user hovers the cursor (22) near the joining point, i.e. the joining point is within said predetermined proximity of the cursor, the last performed adequate user action (8,5) is displayed in a first suggestion menu (1) (See FIG. 5).

Figure 6:
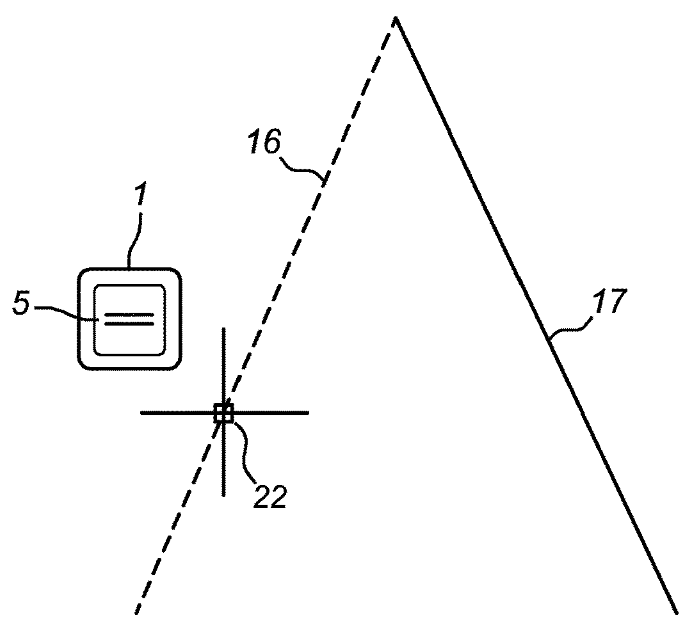

If the user hovers the cursor further from said joining point, another first suggestion menu (1) is provided with last user action (5), i.e. a horizontal constraint user action (See FIG. 6).

FIGS. 7-13 illustrate subsequent steps of manipulating a CAD 3D model layout in accordance with one embodiment of the invention.

Figure 7:
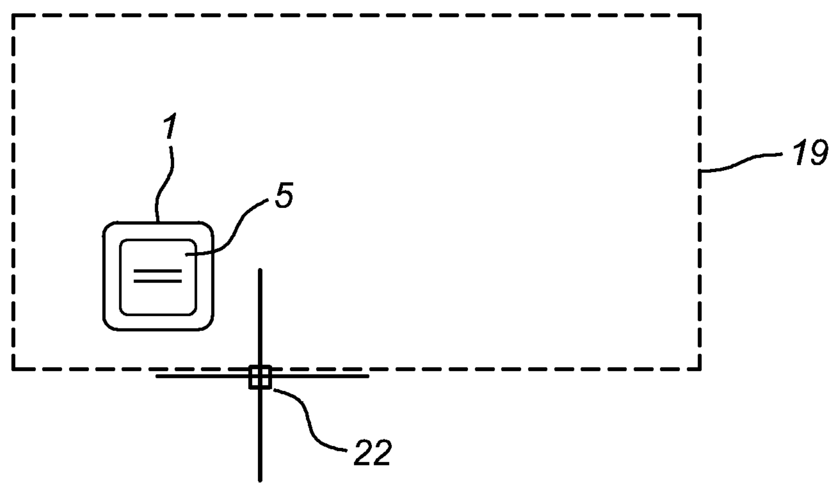
FIGS. 7-13 illustrate subsequent steps of manipulating a CAD 3D model layout in accordance with one embodiment of the invention.

If the cursor (22) is hovering over a rectangle (19), a first suggestion menu (1) is shown to the user (See FIG. 7). Said entity (19) is highlighted and said first suggestion menu (1) provides the last adequate executed user action (5).

Figure 8:
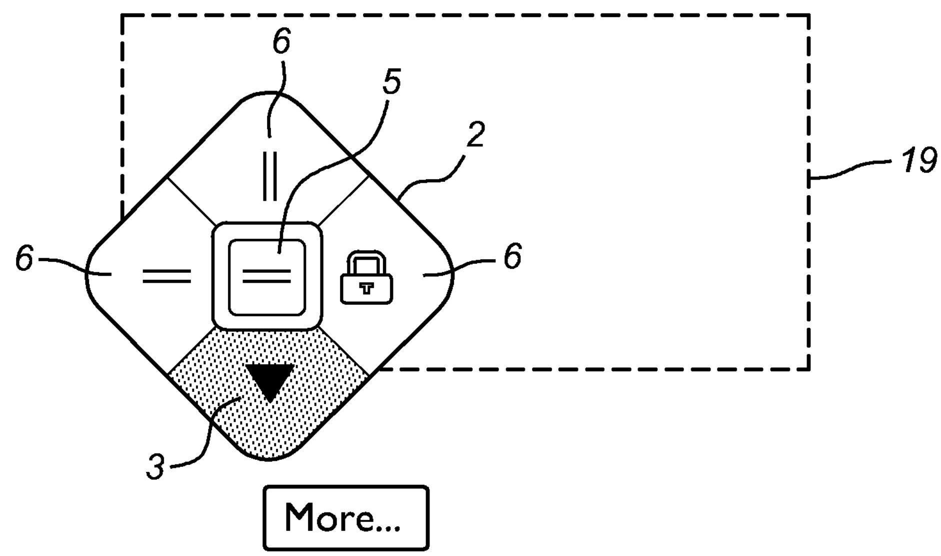

When the cursor is moved on top of said first suggestion menu (1), a second suggestion menu (2) is shown to the user, providing 3 adequate user actions (6) (See FIG. 8).

Figure 9:
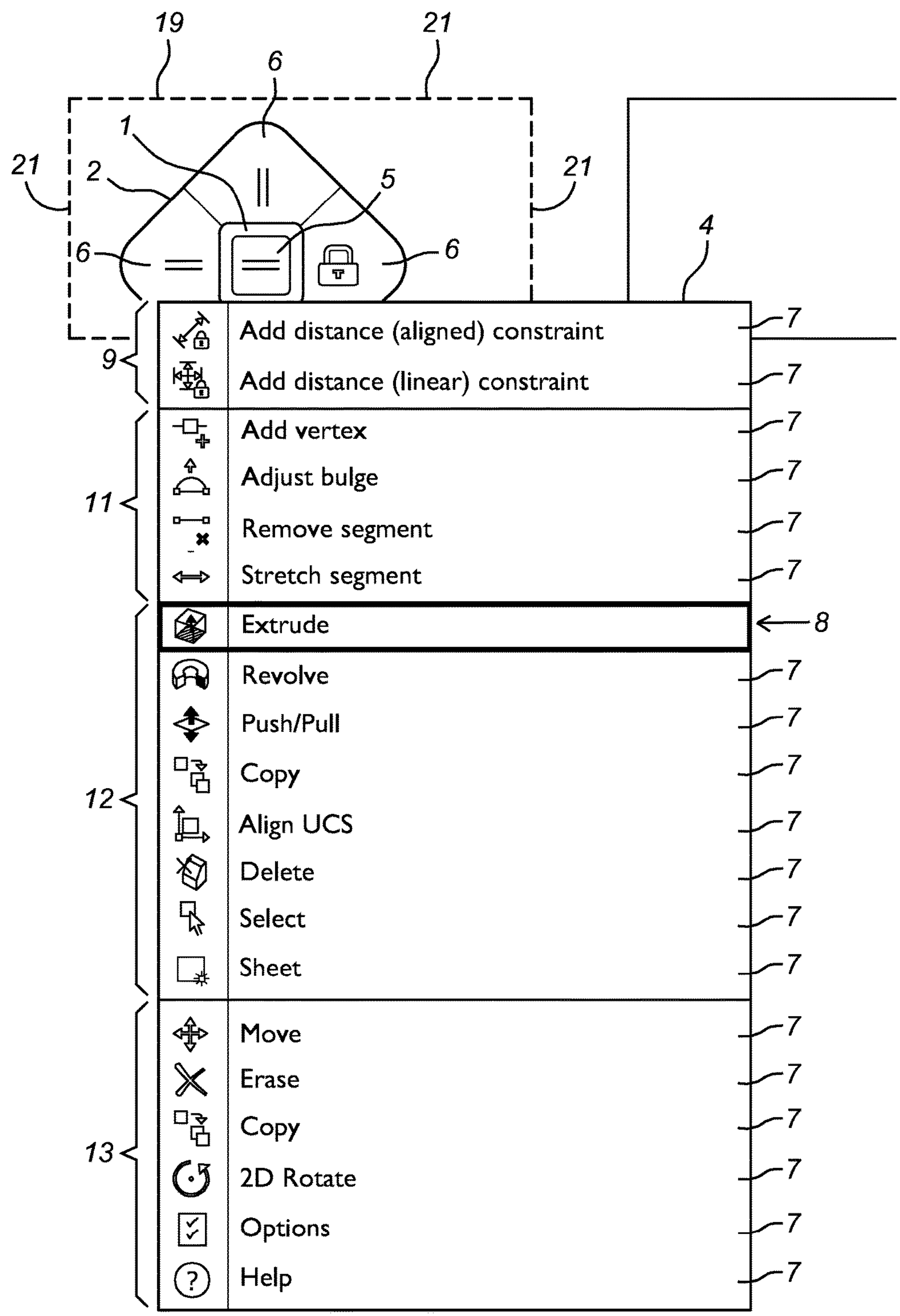

When the user moves the cursor towards the dropdown button (3), an expanded second suggestion menu (4) is shown (See FIG. 9). Next to the last adequate executed user action (5) and the adequate user actions (6) from the second suggestion menu (2), a dropdownbox (4) is shown to the user with extra adequate user actions (7,8).

This list of adequate user actions (5,6,7,8) is ordered in groups of related adequate user actions, such as the constraints group (9), 2D editing group (11), direct modeling group (12) and general group (13) (See FIG. 9). User actions (5, 6) are part of the first prioritized group, i.e. the constraints group (9). Said groups are ordered via a weighed prioritization based on relevancy, execution recentness, execution frequency and sequence execution frequency of adequate user actions for the entities (14) and (15). For example also the subentities (21) are taken into account as possible combinations for the determination and weighed prioritization of user actions.

Figure 10:
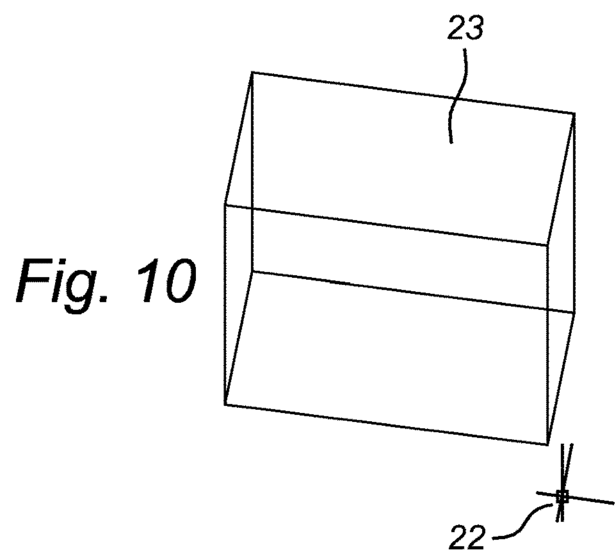
Figure 11:
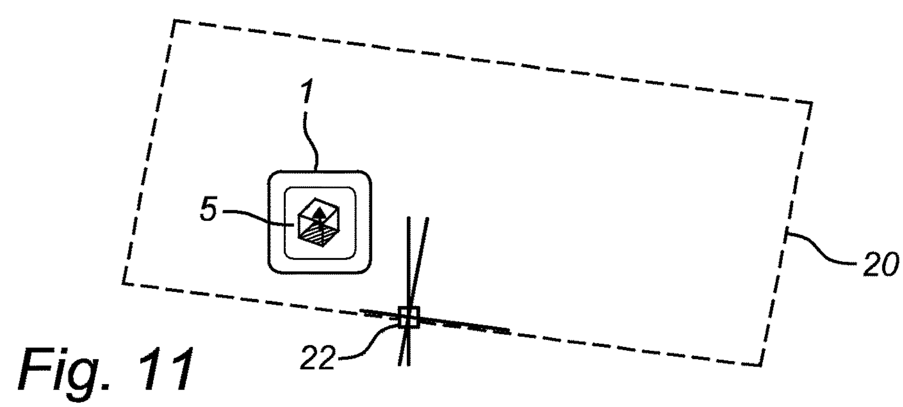
Figure 12:
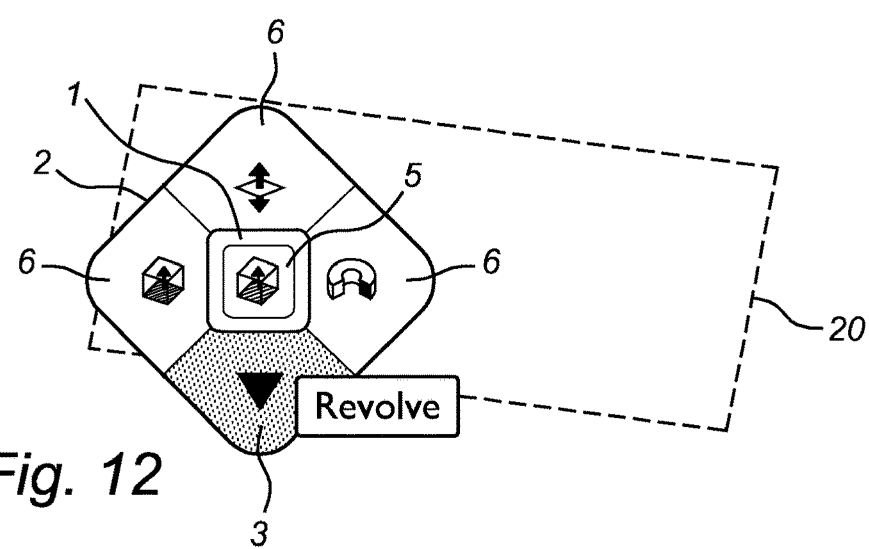

When the user selects the extrude user action (8), a extruding operation will be performed on said rectangle (19). FIG. 10 shows the extruded box (23) of the entity (19).

When subsequently for another rectangular entity (20), the user hovers the cursor (22) on said entity (20), the last performed adequate user action (8,5) is displayed in a first suggestion menu (1) (See FIG. 11), i.e. the extrude action.

When the cursor is moved on top of said first suggestion menu (1), a second suggestion menu (2) is shown to the user, providing 3 adequate user actions (6) (See FIG. 12) from the direct modeling group (12).

Figure 13:
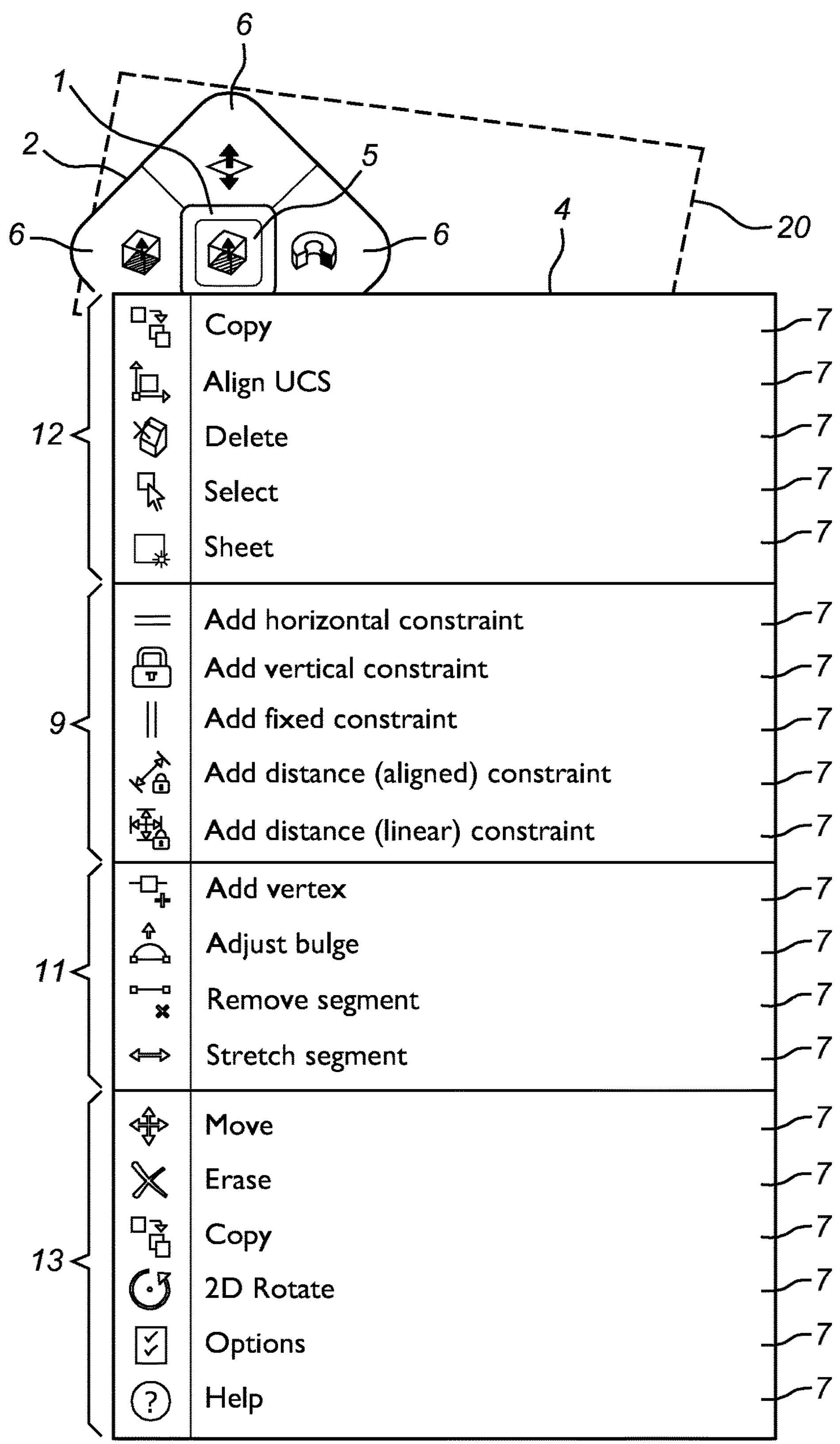

When the user moves the cursor towards the dropdown button (3), an expanded second suggestion menu (4) is shown (See FIG. 13). Next to the last adequate executed user action (5) and the adequate user actions (6) from the second suggestion menu (2), a dropdownbox (4) is shown to the user with extra adequate user actions (7,8).

Contrary to the step in FIG. 9, the order of user action groups is changed. Particularly as the last performed user action on a rectangle or subline from a rectangle is from the direct modeling group, in an embodiment of the invention said group is shifted to the first provided user action group in said suggestion menus (1,2,4).

Although the present invention has been described with reference to preferred embodiments thereof, many modifications and alternations may be made by a person having ordinary skill in the art without departing from the scope of this invention which is defined by the appended claims.

What is claimed is:

1. A method for manipulating a computer aided design (CAD) model, comprising the computer-implemented steps of:

a) determining one or more entities in a CAD model that are associated with a cursor controlled by a user;

b) determining a set of one or more adequate user actions to execute on said one or more entities;

c) providing a suggestion menu comprising said set of one or more adequate user actions;

characterized in, that said set of one or more adequate user actions is partly determined by previously executed user actions by said user, wherein each one of the previously executed user actions is a CAD action previously executed on said one or more entities in the CAD model.

2. The method according to claim 1, wherein said set of one or more adequate user actions is partly determined by frequently executed user actions by said user.

3. The method according to claim 1, wherein said set of one or more adequate user actions is partly determined by frequently executed sequences of user actions by said user.

4. The method according to claim 1, wherein said set of one or more adequate user actions is partly determined by a geometric analysis on any of one or more entities in an area within a predetermined proximity of the cursor, wherein said geometric analysis comprises analyzing neighboring entities and their mutual geometric relationship and position.

5. The method according to claim 1, wherein step c is performed by:

c1) providing a first suggestion menu, comprising one adequate user action;

c2) providing a second suggestion menu, comprising said set of one or more adequate user actions.

6. The method according to claim 1, wherein said set of one or more adequate user actions is ordered in groups of related adequate user actions.

7. The method according to claim 1, wherein said step a is performed by:

a1) determining a first entity of a CAD model;

a2) hovering the cursor on or within a predetermined proximity of a second entity of said CAD model.

8. The method according to claim 7, wherein step a1 is performed by selecting said first entity.

9. The method according to claim 7, wherein said first entity may be two or more entities.

10. The method according to claim 7, wherein step a1 is performed by said hovering of the cursor in step a2, wherein said hovering of the cursor is on or within a predetermined proximity of said second entity.

11. The method according to claim 7, wherein said first and/or said second entity is a subentity.

12. The method according to claim 7, wherein said first or second entity is not part of a same entity as of said second or first entity respectively.

13. The method according to claim 1, wherein said set of one or more adequate user actions is determined by a weighed prioritization based on geometrical analysis, execution recentness, execution frequency and sequence execution frequency of one or more adequate user actions determined for one or more possible combinations of said one or more entities in an area within a predetermined proximity of the cursor.

14. A method for manipulating a computer aided design (CAD) model, comprising the computer-implemented steps of:

a) determining one or more entities in a CAD model that are associated with a cursor controlled by a user;

b) determining a set of one or more adequate user actions to execute on said one or more entities;

c) providing a suggestion menu, comprising said set of one or more adequate user actions;

characterized in that said set of one or more adequate user actions is partly determined by a geometric analysis on any of one or more entities in an area within a predetermined proximity of the cursor, wherein said geometric analysis comprises analyzing neighboring entities and their mutual geometric relationship and position.

15. A computer program product for manipulating a computer aided design (CAD) model, said computer program product comprising at least one computer-readable storage medium having computer-readable program code portions stored therein, the computer-readable program code portions comprising instructions for:

a) determining one or more entities in a CAD model that are associated with a cursor controlled by a user;

b) determining a set of one or more adequate user actions to execute on said one or more entities;

c) providing a suggestion menu, comprising said set of one or more adequate user actions;

characterized in that said set of one or more adequate user actions is partly determined by previously executed user actions by said user, wherein each one of the previously executed user actions is a CAD action previously executed on said one or more entities in the CAD model.

16. A server for manipulating a computer aided design (CAD) model using a computing device connected to the server via a network, the server comprising:

an input receiving module, the input receiving module configured to receive determination of one or more entities in a CAD model set forth by the user;

at least one processor, the at least one processor configured to:

a) determine one or more entities in a CAD model that are associated with a cursor controlled by a user;

b) determine a set of one or more adequate user actions to execute on said one or more entities;

c) provide a suggestion menu, comprising said set of one or more adequate user actions;

characterized in that said set of one or more adequate user actions is partly determined by previously executed user actions by said user, wherein each one of the previously executed user actions is a CAD action previously executed on said one or more entities in the CAD model.

17. The computer program product according to claim 15, wherein said set of one or more adequate user actions is determined by a weighed prioritization based on geometrical analysis, execution recentness, execution frequency and sequence execution frequency of one or more adequate user actions determined for one or more possible combinations of said one or more entities in an area within a predetermined proximity of the cursor.

18. The server according to claim 16, wherein said set of one or more adequate user actions is determined by a weighed prioritization based on geometrical analysis, execution recentness, execution frequency and sequence execution frequency of one or more adequate user actions determined for one or more possible combinations of said one or more entities in an area within a predetermined proximity of the cursor.

* * * * *